(12) United States Patent
Lin et al.

(10) Patent No.: US 11,164,956 B2
(45) Date of Patent: Nov. 2, 2021

(54) CAPPING LAYER FOR GATE ELECTRODES

(71) Applicant: TAIWAN SEMICONDUCTOR MANUFACTURING CO., LTD., Hsinchu (TW)

(72) Inventors: Chin-Hsiang Lin, Hsinchu (TW); Teng-Chun Tsai, Hsinchu (TW); Akira Mineji, Hsinchu County (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/548,918

(22) Filed: Aug. 23, 2019

(65) Prior Publication Data
US 2021/0057543 A1 Feb. 25, 2021

(51) Int. Cl.
*H01L 29/66* (2006.01)
*H01L 29/45* (2006.01)
*H01L 29/49* (2006.01)
*H01L 21/311* (2006.01)
*H01L 21/321* (2006.01)
*H01L 29/78* (2006.01)

(52) U.S. Cl.
CPC .. *H01L 29/66515* (2013.01); *H01L 21/31111* (2013.01); *H01L 21/31144* (2013.01); *H01L 21/3212* (2013.01); *H01L 29/45* (2013.01); *H01L 29/4983* (2013.01); *H01L 29/66795* (2013.01); *H01L 29/7851* (2013.01)

(58) Field of Classification Search
CPC ........... H01L 29/66515; H01L 21/3212; H01L 29/7851; H01L 29/4983; H01L 29/66795; H01L 29/45; H01L 21/31111; H01L 21/31144; H01L 21/02181; H01L 21/02178; H01L 21/02194; H01L 21/0228; H01L 29/41791; H01L 29/0847; H01L 27/0886; H01L 21/823431; H01L 21/823468; H01L 21/823475
See application file for complete search history.

(56) References Cited

U.S. PATENT DOCUMENTS

2020/0144118 A1* 5/2020 Cheng ............... H01L 21/76897
2020/0335593 A1* 10/2020 Lu ....................... H01L 29/0847

* cited by examiner

*Primary Examiner* — Edward Chin
(74) *Attorney, Agent, or Firm* — Sterne, Kessler, Goldstein & Fox P.L.L.C.

(57) ABSTRACT

The present disclosure describes a method for forming a hard mask on a transistor's gate structure that minimizes gate spacer loss and gate height loss during the formation of self-aligned contact openings. The method includes forming spacers on sidewalls of spaced apart gate structures and disposing a dielectric layer between the gate structures. The method also includes etching top surfaces of the gate structures and top surfaces of the spacers with respect to a top surface of the dielectric layer. Additionally, the method includes depositing a hard mask layer having a metal containing dielectric layer over the etched top surfaces of the gate structures and the spacers and etching the dielectric layer with an etching chemistry to form contact openings between the spacers, where the hard mask layer has a lower etch rate than the spacers when exposed to the etching chemistry.

20 Claims, 16 Drawing Sheets

CAPPING LAYER FOR GATE ELECTRODES

BACKGROUND

The process of forming self-aligned source/drain contacts involves etching operations that can damage top portions of a transistor's gate structure due to physical ion bombardment. The damaged portions of the transistor's gate can be removed by over polishing, which results in gate height loss and transistor performance degradation.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
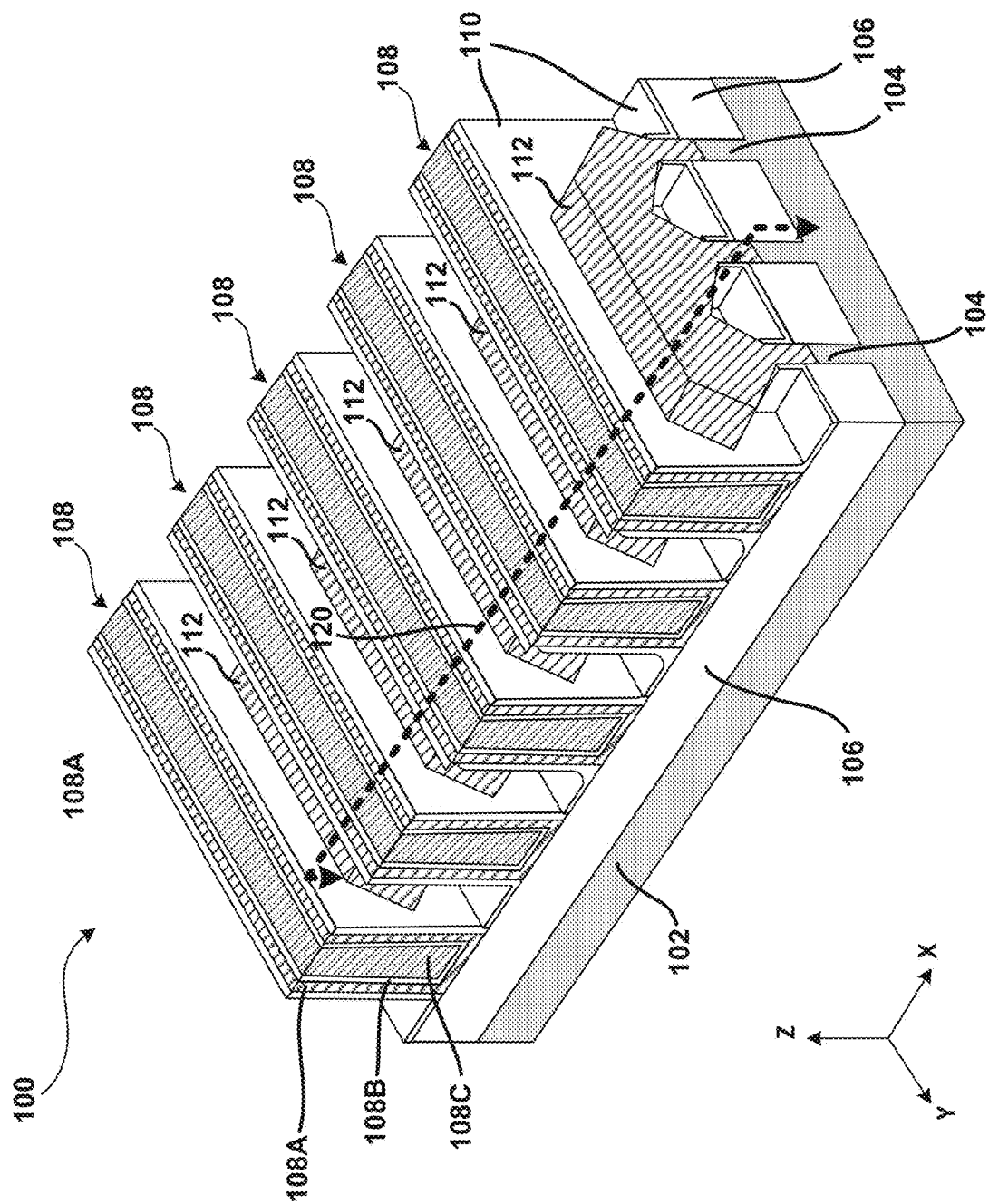
FIG. 1 is partial isometric view of fin field-effect transistor (finFET) structures in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4 and ±5% of the target value).

The term "vertical," as used herein, means nominally perpendicular to the surface of a substrate.

During the process of forming source/drain self-aligned contacts ("S/D SAC"), transistor gate structures are utilized as an etch mask to achieve alignment in tight gate pitch geometries (e.g., between about 15 nm and about 25 nm). However, during the etching process, the transistor gate structures are exposed to the etching chemistry and can become susceptible to gate spacer loss and top corner rounding if the etching chemistry has low etching selectivity between the dielectric material that is being etched and the materials in the transistor's gate structure, including the gate spacers. Further, forming S/D SAC with aggressive aspect ratios (e.g., between about 4:1 and about 6:1) can exacerbate the damage to the gate structures because high aspect ratio S/D SAC require a longer etch. If the damaged portion of the gate structure is not removed, the resulting S/D SAC may electrically short with the gate structure in locations where the gate spacer is the thinnest. To prevent shorting between the S/D SAC and the gate structure, the transistor gate structures are over-polished to remove the damaged gate portions—this can result in gate height loss which in turn compromises the transistor's performance.

Integration schemes utilizing silicon nitride protective layers disposed on the gate structure may not reduce the gate spacer loss or eliminate the gate height loss. This is paramount for technology nodes where the pitch between the gates are tighter (e.g., between about 10 nm and about 20 nm) and the S/D SAC aspect ratio is higher (e.g., between about 6:1 to about 8:1).

The present disclosure is directed to a method for forming a hard mask layer that can minimize or eliminate gate spacer loss and gate corner rounding during the process of forming S/D SAC openings. Consequently, an over-polish to remove damaged gate portions can be reduced to limit the gate height loss to, for example, about 20 nm or less. In some embodiments, the hard mask layer is resistant to the etching chemistry used in the process of forming S/D SAC openings. According to some embodiments, the hard mask layer includes a metal-oxide ($MO_x$) (e.g., $ZrO_x$, where x can range from about 1.7 to 2.1), a metal-silicate ($MSi_xO_y$) (e.g., $ZrSi_xO_y$, where x can range from about 0.5 to about 1.5 and y can range from about 2.0 to about 4.0), a metal-aluminate ($MAl_xO_y$) (e.g., $ZrAl_xO_y$, where x can range from about 0.5 to about 1.5 and y can range from about 2.0 to about 4.0), a metal-nitride ($MN_x$) (e.g., $HfN_x$, where x can range from about 0.8 to about 1.2), a metal-carbide ($MC_x$) (e.g., $HfC_x$, where x can range from about 0.7 to about 1.0), or combinations thereof. Further, the metal in the hard mask layer includes a transition metal or a rare earth metal, such as hafnium (Hf), zirconium (Zr), titanium (Ti), aluminum (Al), yttrium (Y), ytterbium (Yb), erbium (Er), or combinations thereof. In some embodiments, the hard mask layer exhibits a crystalline, an amorphous, or a laminate amorphous microstructure. In some embodiments, the hard mask is a bi-layer with a silicon-based insulator (e.g., silicon nitride (SiN) or silicon oxide ($SiO_2$)) surrounded by a metal-containing insulator that includes Hf, Zr, Ti, Y, Yb, Er, Al, Si, or combinations thereof. In other embodiments, the hard mask is a bi-layer that includes a first metal-containing insulator surrounded by a second metal-containing insulator. The first metal-containing insulator is a metal oxide that includes a transition metal or a rare earth metal, such as Hf, Zr, Ti, Y, Yb, Er, or Al, and the second metal-containing insulator is a metal-silicate or a metal-aluminate compound that includes a transition metal or a rare earth metal, such as Hf, Zr, Ti, Y, Yb, Er, or Al.

According to some embodiments, FIG. 1 is a partial isometric view of fin field-effect transistor (finFET) structures 100. FIG. 1 shows selective portions of finFET structures 100 and other portions may not be shown for simplicity. These other portions may include additional components such as spacers, liners, contact structures, other layers, doped regions, etc. Further, finFET structures 100 in FIG. 1 are shown for illustration purposes and may not be drawn to scale. Therefore, certain elements of finFET structures 100 in FIG. 1 and in subsequent figures may have been augmented for clarity and ease of visualization.

As shown in FIG. 1, FinFET structures 100 are formed on a substrate 102 having semiconductor fins 104 ("fins 104"). Fins 104 are formed perpendicular to the top surface of substrate 102 and are electrically isolated from one another via isolation regions 106. Fins 104 may be patterned by any suitable method. For example, fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in an embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin 104. In some embodiments, isolation regions 106 are filled with a dielectric material, such as silicon oxide, and form shallow trench isolation (STI) regions between fins 104.

In some embodiments, substrate 102 and fins 104 include (i) silicon, (ii) a compound semiconductor such as gallium arsenide (GaAs), gallium phosphide (GaP), indium phosphide (InP), indium arsenide (InAs), and/or indium antimonide (InSb), (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof. For example purposes, substrate 102 and fins 104 will be described in the context of crystalline silicon. Based on the disclosure herein, other materials, as discussed above, can be used. These materials are within the spirit and scope of this disclosure.

FinFET structures 100 include gate structures 108 wrapped around the top and sidewall surfaces of fins 104; spacers 110 disposed on sidewall surfaces of gate structures 108; and source/drain ("S/D") epitaxial layers 112 grown on recessed portions of fins 104 not covered by gate structures 108 and spacers 110.

According to some embodiments, gate structures 108 include multiple layers, such as gate dielectric 108A, work function layers 108B, and metal fill 108C. Gate structures 108 may also include additional layers not shown in FIG. 1 for simplicity. These layers can include interfacial dielectric layers disposed between fin 104 and gate dielectric 108A, capping layers and barrier layers disposed between gate dielectric 108A and work-function layers 108B, and additional barrier layers between work-function layers 108B and metal fill 108C. In some embodiments, S/D epitaxial layers 112 can be merged, as shown in FIG. 1, or be un-merged, and can include boron-doped silicon-germanium (SiGe) epitaxial layers, carbon-doped silicon (Si:C) or phosphorous-doped silicon (Si:P) epitaxial layers.

In some embodiments, gate dielectric 108A includes a high-k dielectric such as hafnium-based oxide; work-function layers 108B can include a stack of metallic layers such as titanium nitride, titanium-aluminum, titanium-aluminum carbon, etc.; and metal fill 108C can include a metal such as tungsten.

FIG. 1 shows five gate structures 108. However, based on the disclosure herein, finFET structures 100 can have more or fewer gate structures. In addition, finFET structures 100 can be incorporated into an integrated circuit through the use of other structural components—such as S/D contact structures, gate contact structures, conductive vias, conductive lines, dielectric layers, and passivation layers, which are omitted for simplicity and ease of visualization.

Figure 2:
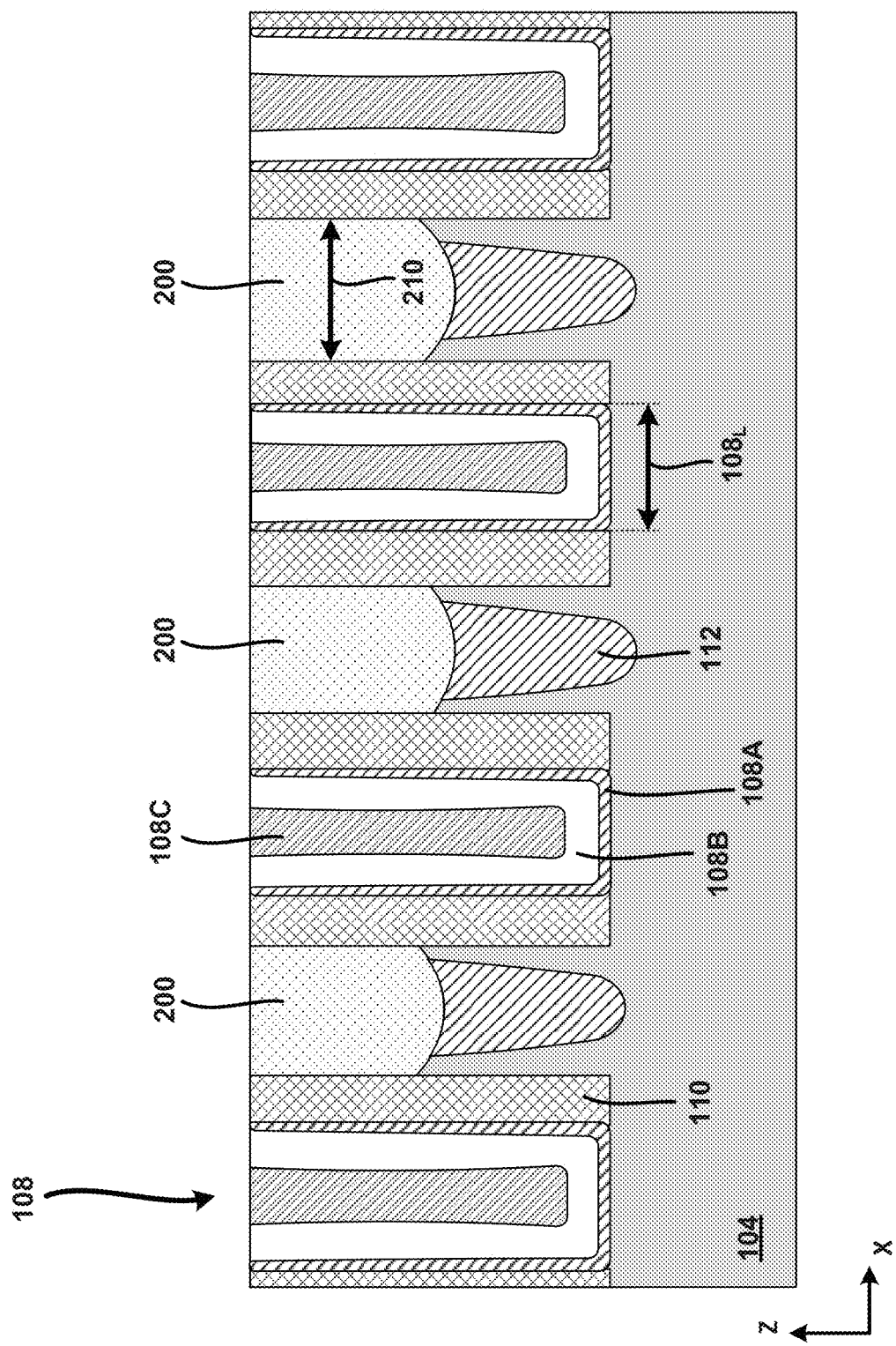
FIG. 2 is a cross-sectional view of fin field-effect transistor (finFET) structures in accordance with some embodiments.

According to some embodiments, FIG. 2 is a partial cross-sectional view of FIG. 1 across cut-line 120 shown in FIG. 1. Cut-line 120 is parallel to the y-axis along a single fin 104, as shown in FIG. 1. FIG. 2 shows additional elements not shown in FIG. 1, such as dielectric layer 200. In some embodiments, dielectric layer 200 is an interlayer dielectric deposited with a flowable chemical vapor deposition process and may include silicon oxide or doped silicon oxide. By way of example and not limitation, dielectric layer 200 can be initially blanket deposited over gate structures 108, and subsequently planarized using a chemical mechanical planarization/polishing (CMP) process so that the top surface of dielectric layer 200 is substantially co-planar with the top surfaces of gate structures 108 as shown in FIG. 2. As a result of the planarization process, dielectric layer 200 becomes disposed between adjacent gate structures 108 above S/D epitaxial layers 112. In some embodiments, spacing 210 between adjacent gate structures 108 can be between about 15 nm and about 25 nm or between about 10 nm and about 20 nm, while gate structures 108 have a physical gate length $108_L$ between about 10 nm and about 20 nm (e.g., between about 10 nm and about 15 nm, between about 12 nm and about 18 nm, and between about 16 nm and about 20 nm).

Figure 3:
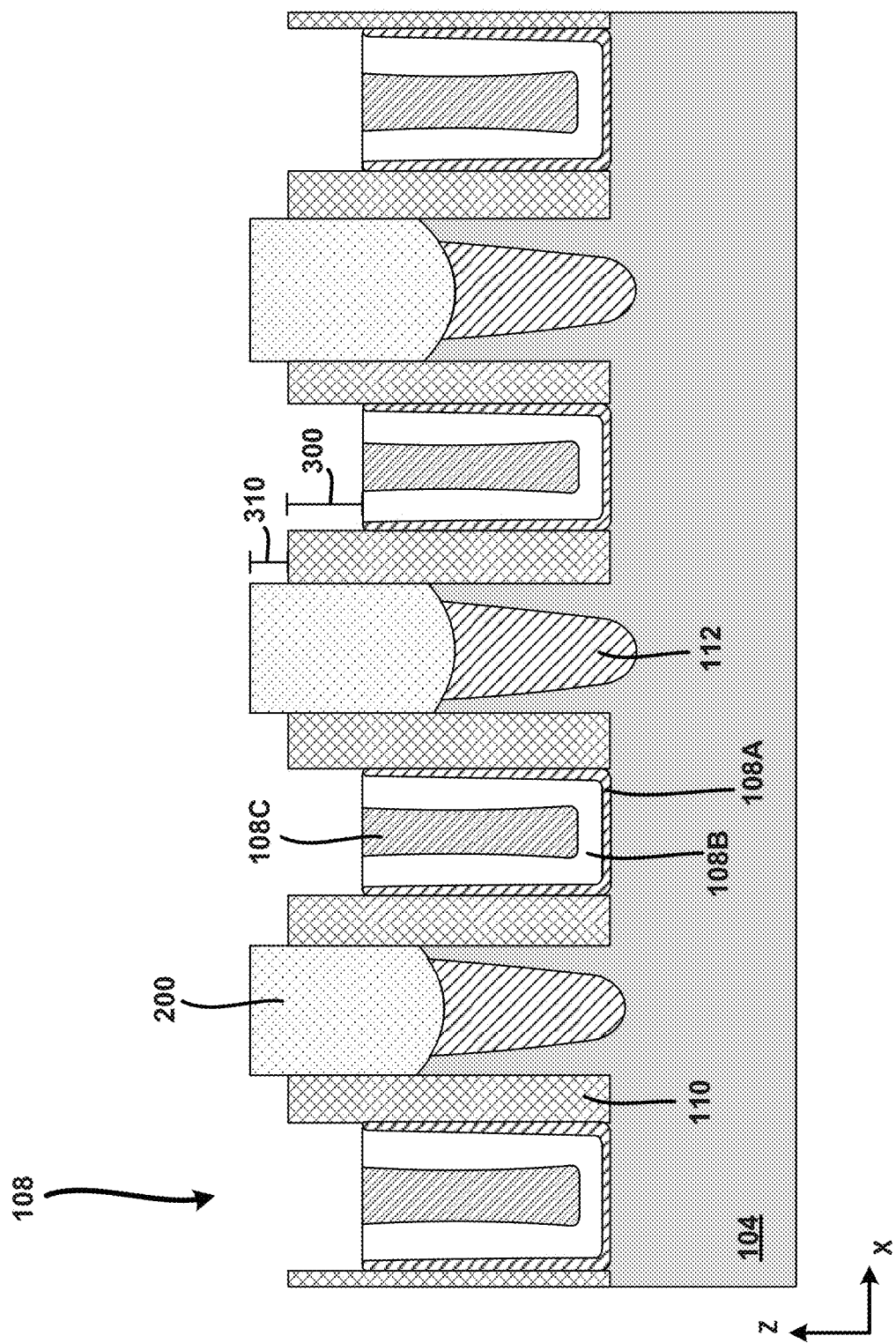
FIG. 3 is a cross-sectional view of fin field-effect transistor (finFET) structures after a gate and spacer recess operation in accordance with some embodiments.

In some embodiments, gate structures 108 and spacers 110 are independently recessed with respect to dielectric layer 200 as shown in FIG. 3. In some embodiments, recess 300 of gate structures 108 can be between about 15 nm and about 40 nm (e.g., between about 15 nm and about 25 nm, between about 20 nm and about 35 nm, and between about 30 nm and about 40 nm), and recess 310 of spacers 110 can be between about 2 nm and about 15 nm (e.g., between about 2 nm and about 8 nm, between about 6 nm and about 12 nm, and between about 10 nm and about 15 nm). The recess process may involve two or more etching processes with respective etching chemistries selective to the spacer and gate structure materials. According to some embodiments, recesses 300 and 310 facilitate the formation of a capping layer or hard mask layer in a subsequent operation. The hard mask layer protects gate structures 108 and the top surfaces of spacers 110 during the process of forming the S/D contact openings in dielectric layer 200.

Figure 4:
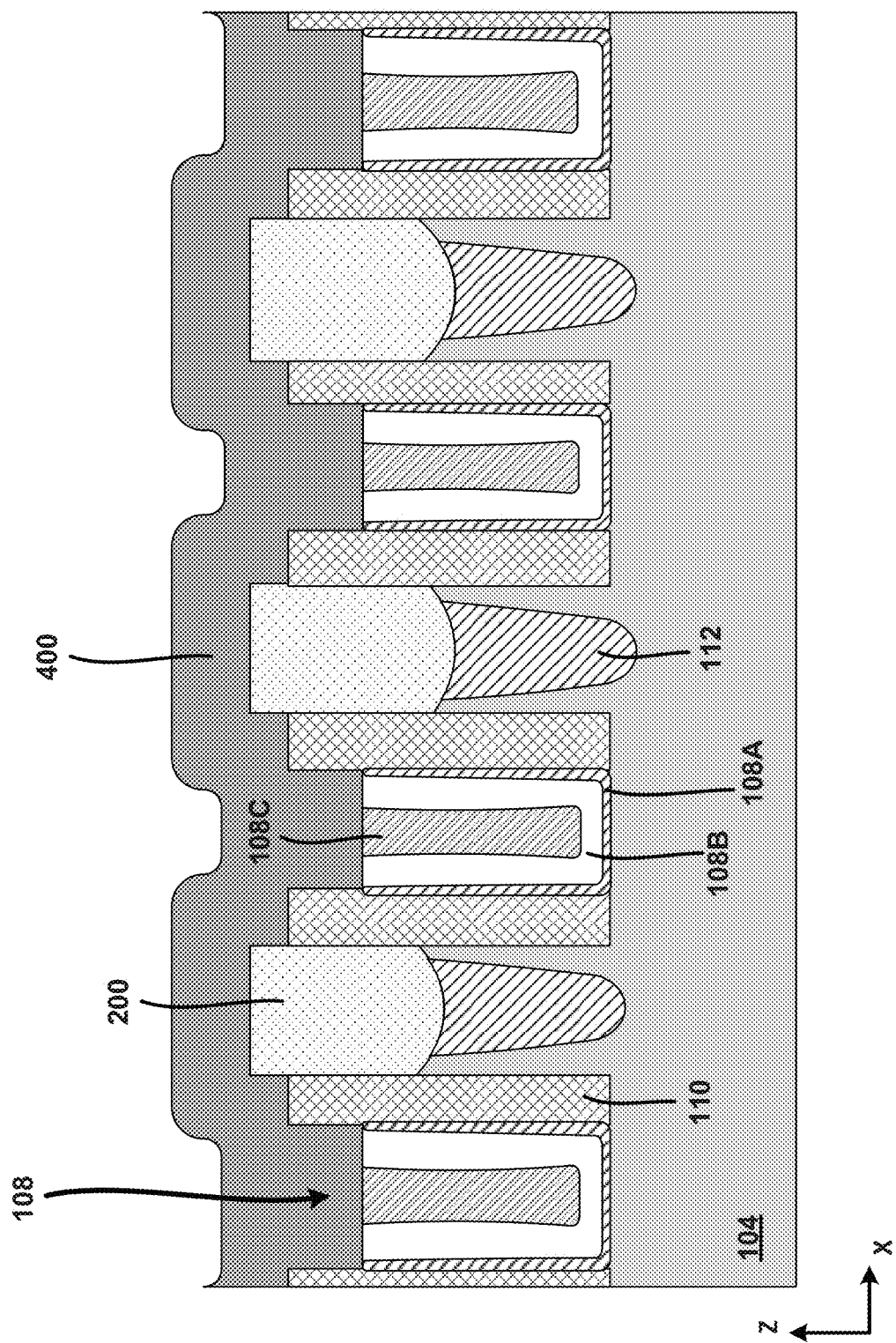
FIG. 4 is a cross-sectional view of fin field-effect transistor (finFET) structures after a hard mask layer deposition in accordance with some embodiments.

In referring to FIG. 4, a capping layer or a hard mask layer 400 is deposited over recessed gate structures 108, recessed spacers 110, and dielectric layer 200. In some embodiments, hard mask layer 400 includes a metal oxide ($MO_x$), a metal nitride ($MN_x$), a metal carbide ($MC_x$), a metal-aluminate ($MAl_xO_y$), a combination of metal oxides ($M1O_x/M2O_x$), a metal-silicate ($MSiO_x$), or combinations thereof. In some embodiments, the metal in the above-mentioned materials is a transition metal (e.g., Hf, Zr, Ti, or Al), a rare earth metal (e.g., Y, Yb, or Er), or combinations thereof. According to some embodiments, hard mask layer 400 is configured to be resistive to fluorine-based etching chemistries and argon plasma pre-clean processes used in the process of forming S/D contact openings. In some embodiments, hard mask layer 400 is configured to be resistive to chemical and physical etching processes used during the S/D contact opening formation.

Figure 5:
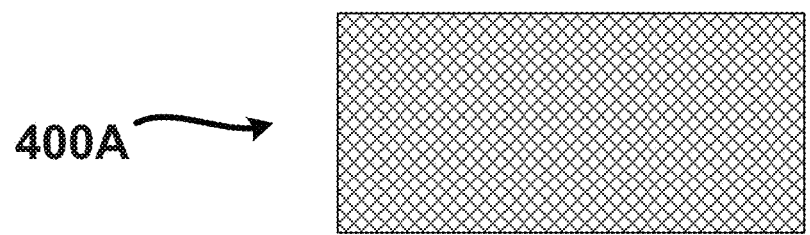
FIG. 5 is cross-sectional views of different types of hard mask layers in accordance with some embodiments.
Figure 5:
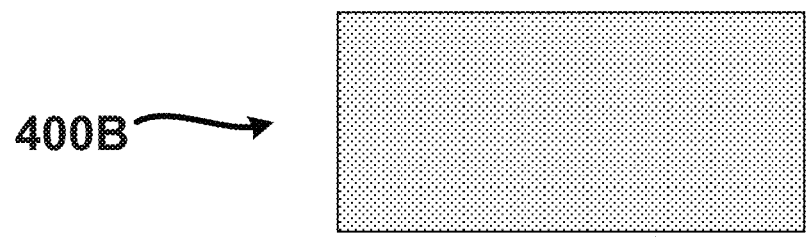
Figure 5:
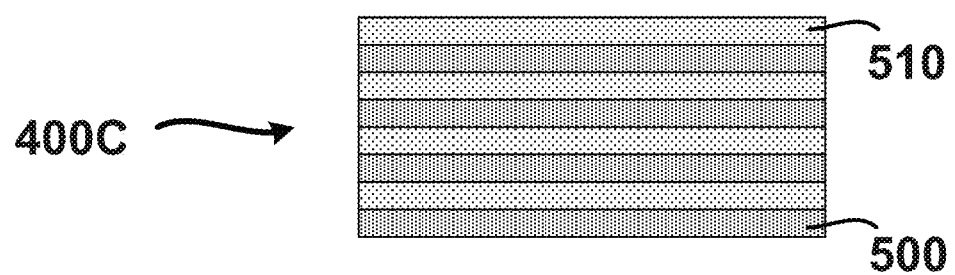

In some embodiments, hard mask layer 400 has a polycrystalline or amorphous microstructure. Alternatively, in some embodiments, hard mask layer 400 is a laminated structure of alternating layers. FIG. 5 shows the three types of hard mask layer 400, according to some embodiments. For example, type 400A is a hard mask layer with a polycrystalline microstructure, type 400B is a hard mask layer with a homogenous amorphous microstructure, and type 400C is a laminate hard mask layer with alternating layers 500 and 510 each having a thickness ranging from about 1 nm to about 3 nm. In some embodiments, layer 500 is a polycrystalline layer and layer 510 is an amorphous layer, or the other way around. In some embodiments, type 400C may be referred to as a "hybrid" type—e.g., a combination of types 400A and 400B.

According to some embodiments, the etch resistance of each hard mask layer type is microstructure depended. For example, type 400A (e.g., polycrystalline) is more etch resistant than types 400B and 400C, and type 400C (e.g., hybrid) is more etch resistant than type 400B (e.g., amorphous). Nevertheless, each hard mask layer type 400A, 400B, and 400C is more etch resistant than the spacer material (e.g., silicon nitride and carbon based dielectrics). Further, types 400B (e.g., amorphous) and 400C (e.g., hybrid) can have a lower dielectric constant (k-value) than type 400A. Thus, in some embodiments, hard mask layer types 400B and 400C may be more appropriate than type 400A (polycrystalline) for FETs which are sensitive to parasitic capacitances.

In some embodiments, the microstructure of hard mask layer 400 is controlled via the hard mask deposition temperature. For example, a polycrystalline hard mask layer can be deposited at higher temperatures than an amorphous hard mask layer. In some embodiments, the microstructure of hard mask layer 400 depends on the stoichiometry of the deposited material. For example, two hard mask layers deposited at the same temperature, but each having a different stoichiometry, can have different microstructures (e.g., amorphous and polycrystalline). By way of example and not limitation, polycrystalline type 400A hard mask layer can be deposited at temperatures between about 280° C. and 350° C., and homogeneous amorphous type 400B hard mask layer can be deposited at temperatures between about 230° C. and about 300° C. Therefore, a laminate type 400C hard mask layer can include layers 500 and 510 formed at different deposition temperatures (e.g., in different reactors within a cluster tool or on different pedestals within the same reactor) or layers 500 and 510 formed at the same deposition temperature (e.g., in the same reactor) but each having a different stoichiometry and a different microstructure.

By way of example and not limitation, type 400A hard mask layer can include zirconium oxide ($ZrO_x$), type 400B hard mask layer can include zirconium-aluminum oxide (ZrAlO) with an aluminum (Al) concentration between about 10 atomic percent ("at. %") and about 25 at. %, and type 400C hard mask layer can include alternating layers of the aforementioned zirconium oxide and zirconium-aluminum oxide layers.

In some embodiments, amorphous layers 500 and 510 can be deposited either in-situ or ex-situ to form type 400C hard mask layer. In some embodiments, hard mask layer 400 can be deposited by thermal or plasma atomic layer deposition methods. Alternative deposition methods (e.g., chemical vapor deposition; "CVD") may be used as long as these alternative deposition methods offer sufficient control over the film thickness and particle generation during the deposition process.

Figure 6:
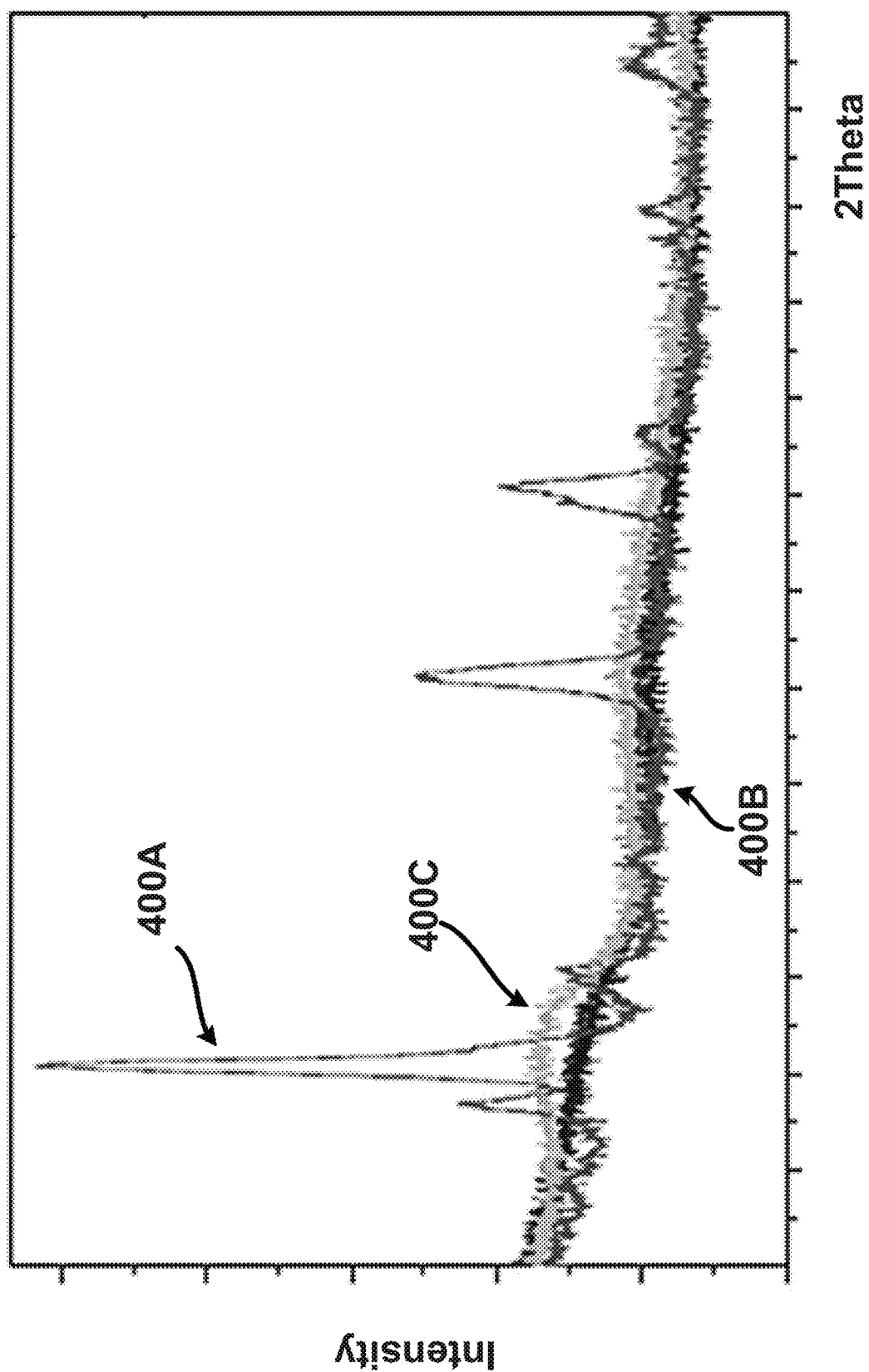
FIG. 6 is an x-ray diffraction plot of intensity curves generated for different hard mask layer types in accordance with some embodiments.

According to some embodiments, FIG. 6 is an x-ray diffraction plot showing the intensity curves from the aforementioned hard mask layer types: 400A (e.g., polycrystalline), 400B (e.g., amorphous), and 400C (e.g., laminate). The intensity curve for each hard mask layer type is plotted against the 2Theta diffraction angles. The curve corresponding to type 400A hard mask layer includes sharp peaks, which are indicative of a polycrystalline microstructure. In contrast, the curve corresponding to type 400B hard mask layer is peak-free (e.g., relatively flat), which is indicative of an amorphous microstructure. Lastly, the curve corresponding to type 400C hard mask layer includes a small broad peak, which is indicative of its hybrid character (e.g., a mix of polycrystalline and amorphous layers). Since the combined thickness of the polycrystalline layers in type 400C hard mask layer is limited, these polycrystalline layers have a small polycrystalline signature as manifested by the low intensity broad peak in FIG. 6.

Figure 7:
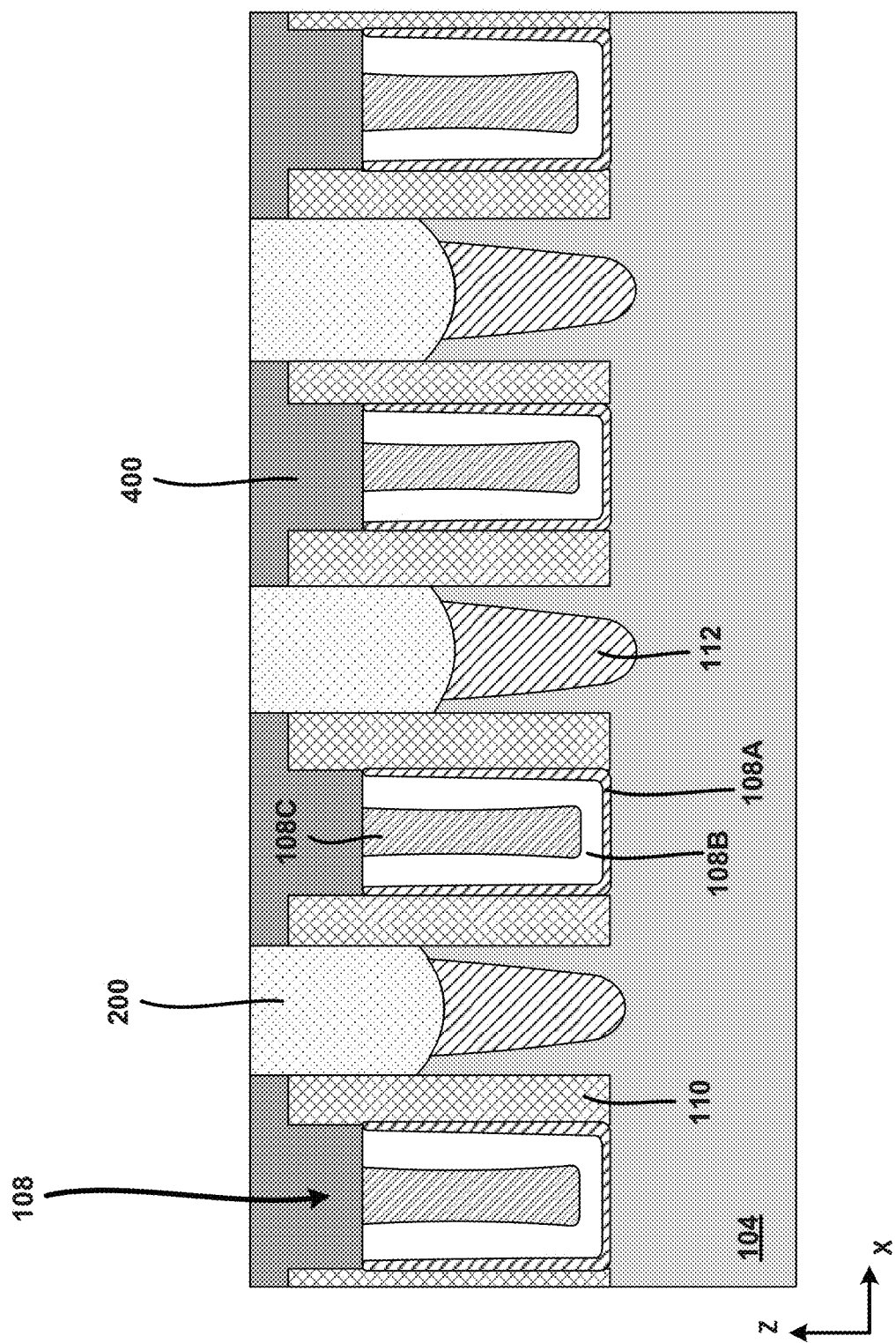
FIG. 7 is a cross-sectional view of fin field-effect transistor (finFET) structures after a hard mask layer planarization process in accordance with some embodiments.

Referring to FIG. 7, hard mask layer 400 is planarized with a CMP process. In some embodiments, the planarization process terminates when dielectric layer 200 is exposed so that the top surfaces of dielectric layer 200 and hard mask layer 400 are substantially co-planar, as shown in FIG. 7. In referring to FIG. 8, another dielectric layer 800 is deposited on dielectric layer 200 and hard mask layer 400. In some embodiments, dielectric layer 800 is an interlayer dielectric that includes silicon oxide, doped silicon oxide (e.g., phosphorous doped, fluorine doped, etc.), or other suitable dielectric materials.

In preparation for the S/D contact opening formation, dielectric layer 800 is patterned with a photoresist layer 810 to form opening(s) 820. In some embodiments, opening(s) 820 exposes all or selected regions of substrate 102 with dielectric layer 200. Regions of substrate 102 covered by dielectric layer 800 and photoresist layer 810 will not be etched and S/D contact openings will not be formed.

Figure 9:
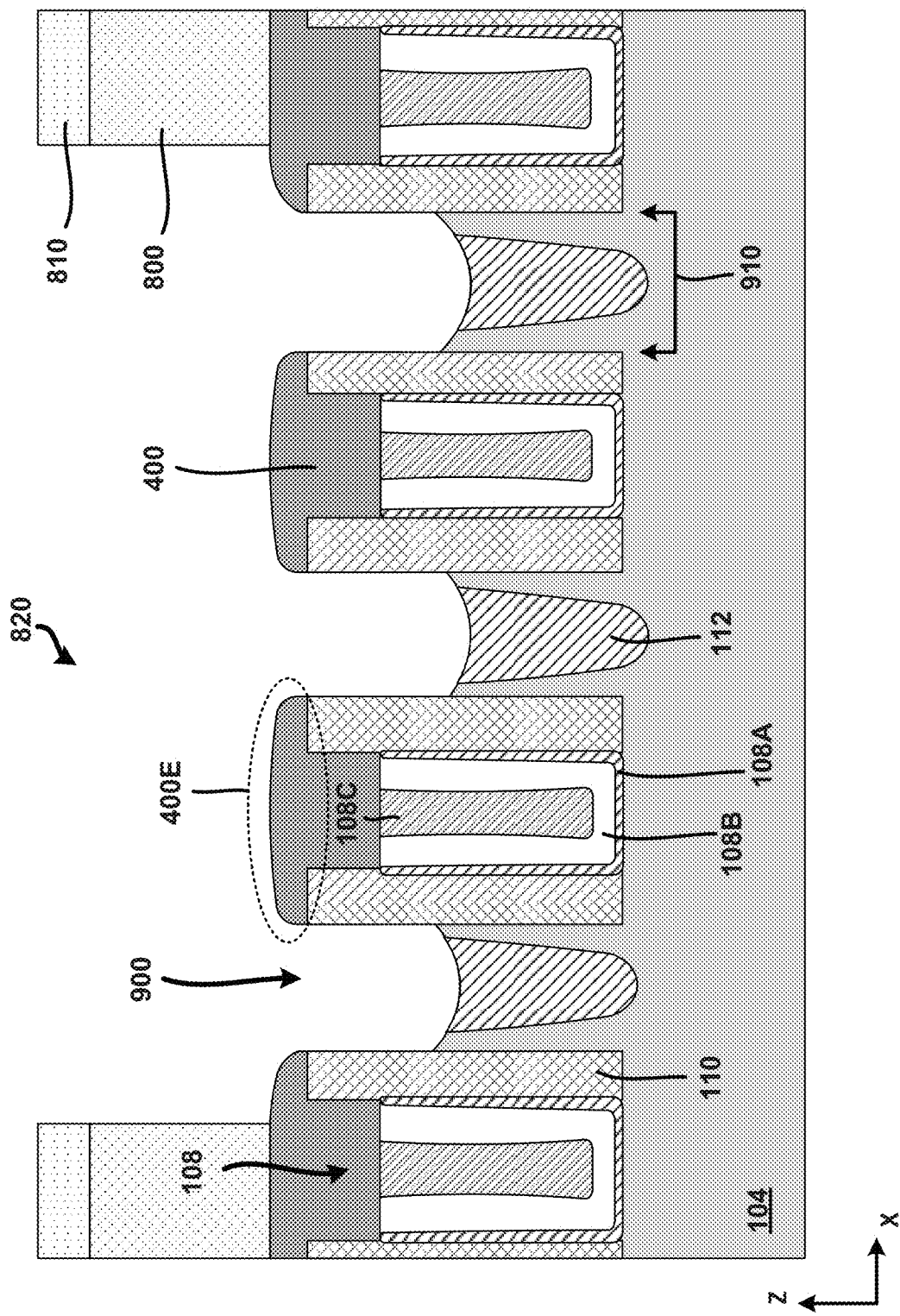
FIG. 9 is a cross-sectional view of fin field-effect transistor (finFET) structures after a process of forming source/drain contact openings in accordance with some embodiments.

FIG. 9 shows the resulting S/D contact openings 900 after an etching process. During etching, exposed dielectric layer 200 is etched (e.g., removed). Dielectric layer 800 is protected from the etching chemistry because photoresist layer 810 functions as etching masks. In some embodiments, S/D contact openings are self-aligned to S/D epitaxial layers 112 because gate structures 108, hard mask layer 400, and spacers 110 function as etching masks. Therefore, spacing 910 between spacers 110 of adjacent gate structures 108 can define the width of S/D openings 900 as shown in FIG. 9.

Figure 8:
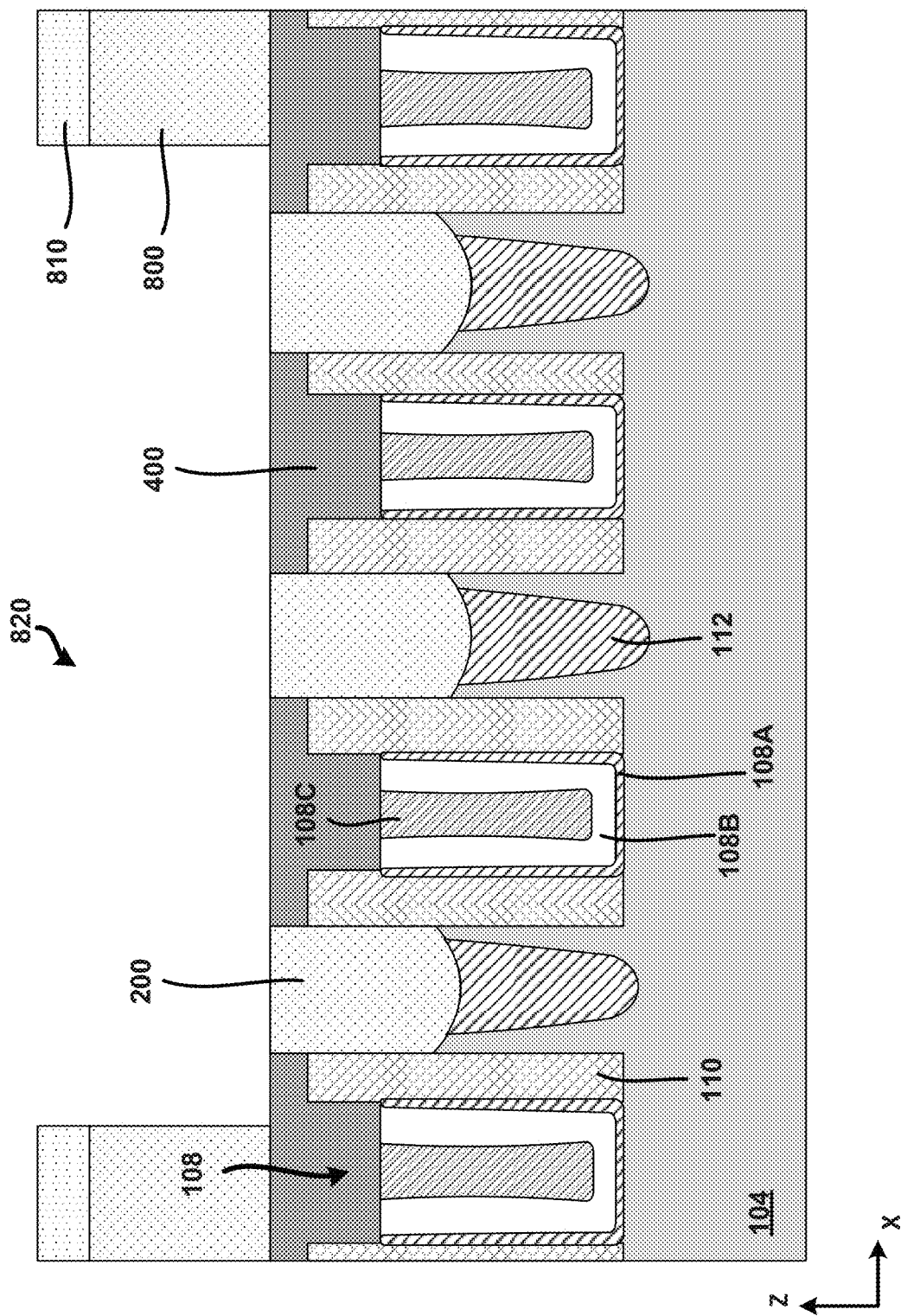
FIG. 8 is a cross-sectional view of fin field-effect transistor (finFET) structures after a process of forming an opening that exposes a portion of the finFET structures in accordance with some embodiments.

In some embodiments, the etching process is anisotropic—e.g., has a higher etching rate in the vertical direction (e.g., z-axis) than in a lateral direction (e.g., x-axis). In some embodiments, the etching process is a combination of chemical and physical etching. In some embodiments, the etching process includes multiple etching operations with different etching chemistries. In some embodiments, the etching chemistry is highly selective towards the material of dielectric layer 200 and less selective towards the material in hard mask layer 400. By way of example and not limitation, the etching selectivity ratio between dielectric layer 200 and spacers 110 can be about 3:1 and between dielectric layer 200 and hard mask layer 400 can be about 10:1. Since the etching chemistry is less selective towards spacers 110, hard mask layer 400 needs to be formed such that it masks (e.g., covers) the top surfaces of spacers 110 during the etching process as shown in FIGS. 8 and 9. Further, spacers 110 and dielectric layer 800 are not laterally etched since the etching process is anisotropic.

Since hard mask layer 400 is exposed to the etching chemistry, the shape of hard mask layer 400 can alter during the etching process. For example, as shown in FIG. 9, the top and side surfaces 400E of hard mask layer 400 can become rounded as they get etched by the etching chemistry. Consequently, hard mask layer 400 may suffer a thickness loss during the forming of S/D contact openings 900. In some embodiments, the amount of hard mask material that is etched depends on the type of hard mask layer 400. For example, as discussed above, a polycrystalline hard mask (e.g., type 400A) would have the least amount of thickness loss compared to a laminate hard mask (e.g., type 400C) and an amorphous hard mask (e.g., type 400B) respectively. An amorphous hard mask will have the highest amount of thickness loss because it has the lowest etching resistance. Therefore, if an amorphous material is used in the hard mask layer, a thicker hard mask layer may be required to compensate for a higher thickness loss during the S/D contact opening formation. On the other hand, if a polycrystalline material is used in the hard mask layer, a thinner hard mask layer may be required because less hard mask material will be etched (less thickness loss) during the S/D contact opening formation. In some embodiments, the thickness of hard mask layer 400 can be adjusted through recess 310 shown in FIG. 3. For example, if hard mask layer 400 is polycrystalline, a short recess 310 may be used (e.g., about 5 nm). If hard mask layer 400 is a laminate, a larger recess 310 may be used (e.g., about 10 nm). Finally, if hard mask layer 400 is amorphous, an even larger recess 310 may be used (e.g., about 15 nm) since the hard mask material consumption during the etching process is expected to be higher.

In some embodiments, the aspect ratio of S/D contact openings 900 is between about 4:1 and about 6:1. In some embodiments, the aspect ratio of S/D contact openings 900 is between about 6:1 and about 8:1. After the formation of S/D contact openings 900, photoresist layer 810 can be removed (e.g., stripped) with a wet etching process.

Figure 10:
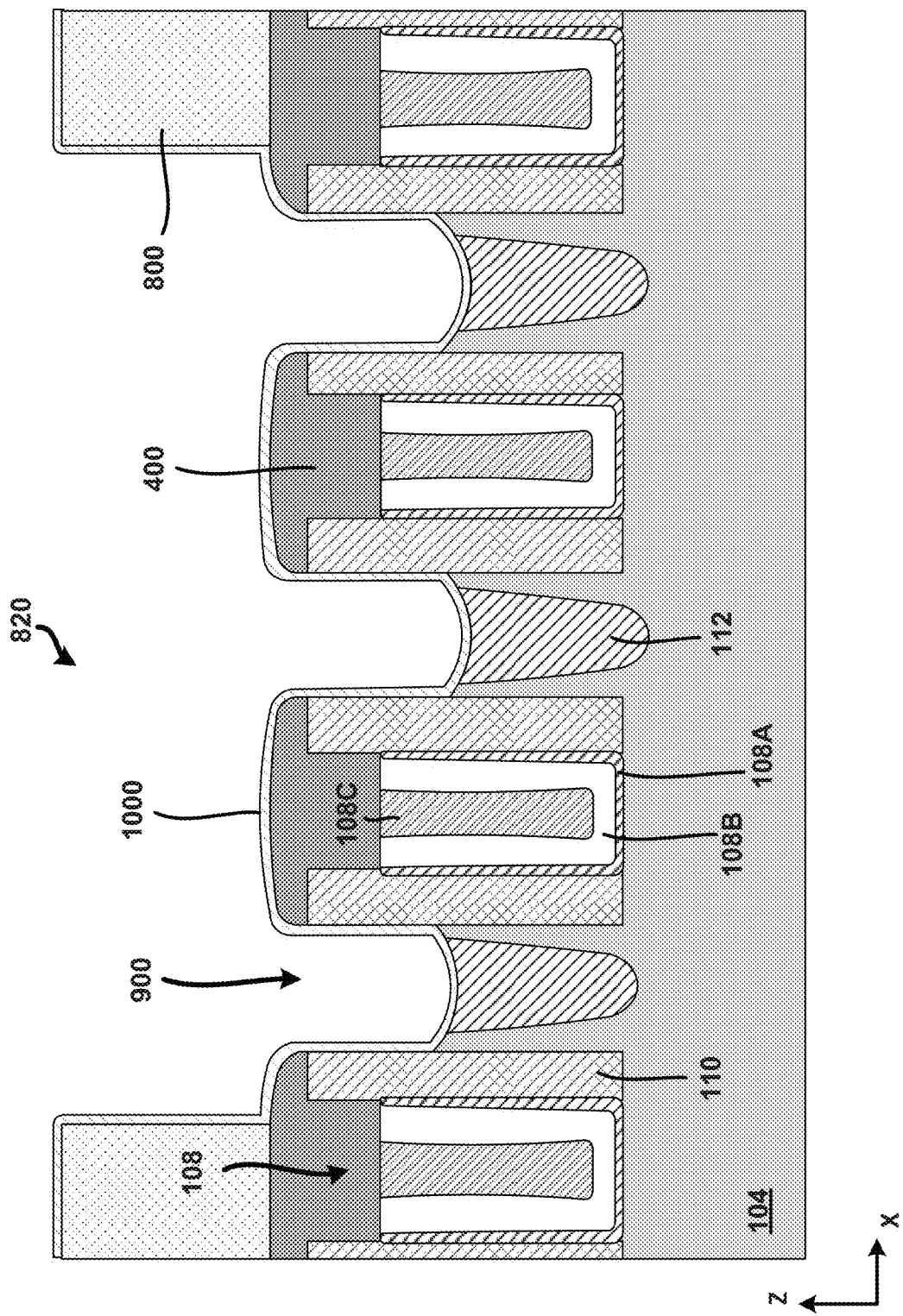
FIG. 10 is a cross-sectional view of fin field-effect transistor (finFET) structures after a liner layer deposition in source/drain contact openings in accordance with some embodiments.

Referring to FIG. 10, a liner layer 1000 can be deposited (e.g., conformally) on exposed surfaces of S/D contact openings 900 and opening(s) 820. By way of example and not limitation, liner layer 1000 is part of the S/D contact metallization stack that functions as a barrier and/or adhesion layer for the conductive material in the S/D contacts. In some embodiments, liner layer 1000 is a stack of two layers, not shown in FIG. 10 for simplicity. For example, liner layer 1000 may include a titanium/titanium nitride stack. In some embodiments, the titanium layer in liner layer 1000 reacts with S/D epitaxial layers 112 to form a cladding silicide layer not shown in FIG. 10 for simplicity.

Figure 11:
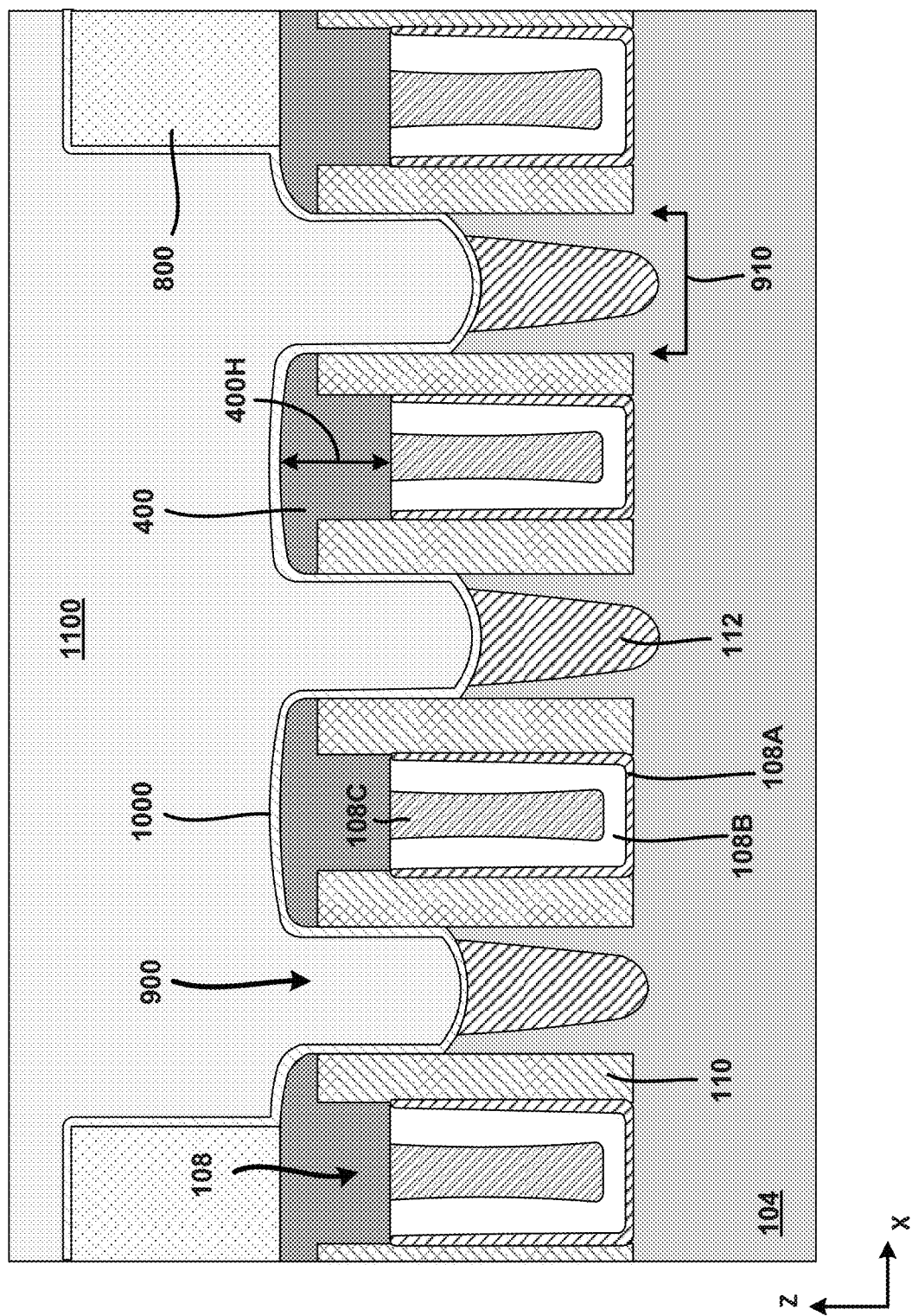
FIG. 11 is a cross-sectional view of fin field-effect transistor (finFET) structures after a metal fill layer is deposited in source/drain contact openings in accordance with some embodiments.
Figure 12:
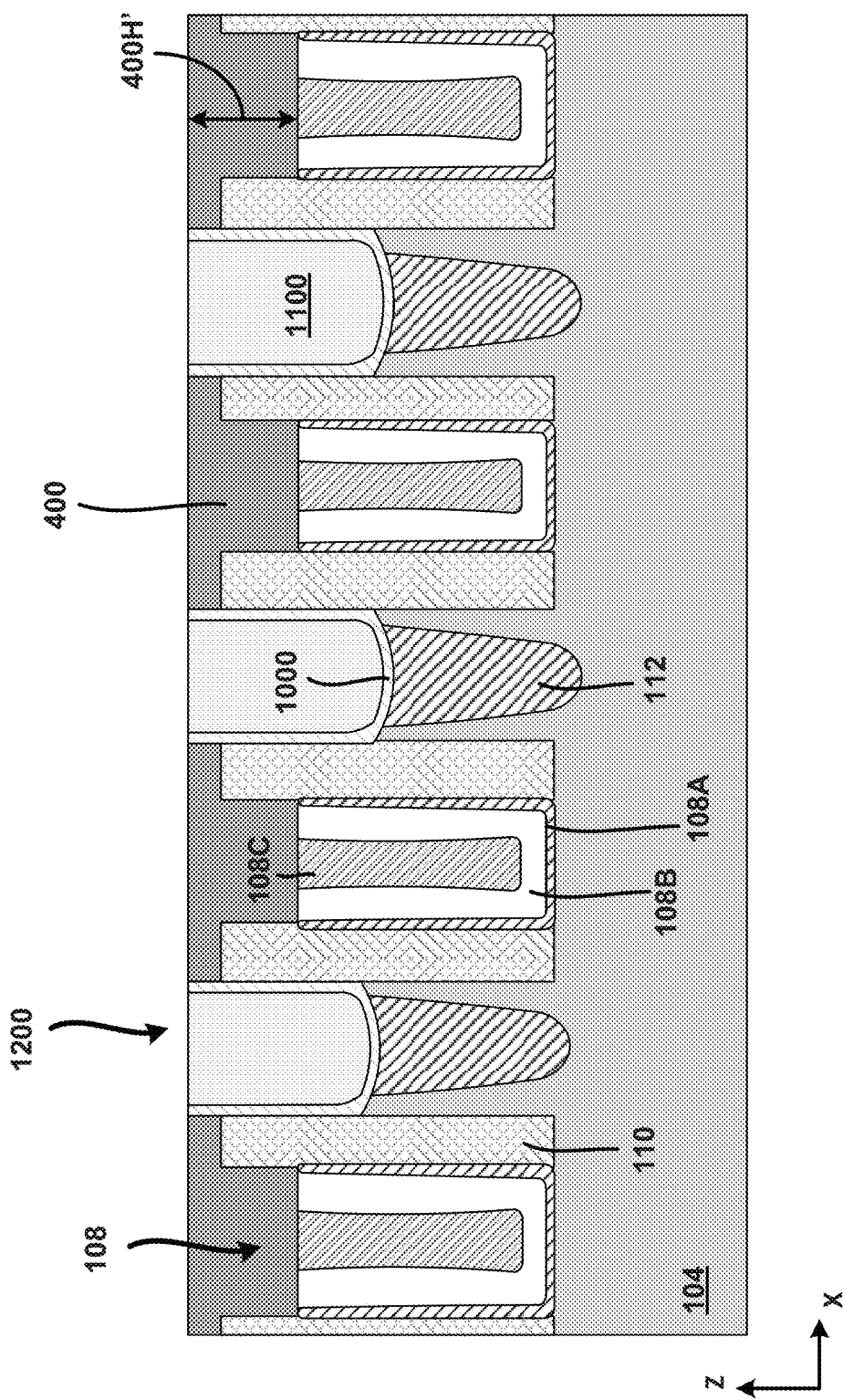
FIG. 12 is a cross-sectional view of fin field-effect transistor (finFET) structures with source/drain contact structures in accordance with some embodiments.

Referring to FIG. 11, a conductive material 1100 is deposited in S/D contact openings 900 and opening(s) 820 shown in FIG. 10. By way of example and not limitation, conductive material 1100 can be cobalt or tungsten and can substantially fill S/D contact openings 900 as shown in FIG. 11. A planarization process, such as a CMP process, can be used to polish down the structure as shown in FIG. 12. After the planarization process, the top surfaces of hard mask layer 400, liner layer 1000, and conductive material 1100 are substantially co-planar. Additionally, dielectric layer 800 is removed. The aforementioned planarization process concludes the process of forming S/D contacts 1200.

In some embodiments, the aforementioned planarization process removes a portion of the top surface of hard mask layer 400. By way of example and not limitation, the planarization process can remove about 20 nm from pre-CMP height 400H of hard mask layer 400 shown in FIG. 11. In some embodiments, post-CMP height 400H' of hard mask layer 400 shown in FIG. 12 is between about 20 nm and about 40 nm (e.g., between about 20 nm and 30 nm, between about 25 nm and 35 nm, and between about 30 nm and about 40 nm).

In some embodiments, the hard mask layer is a bilayer that includes a liner layer and a fill layer. For example, referring to FIG. 13, a hard mask layer 1300 includes a liner layer 1310 and a fill layer 1320. In some embodiments, liner layer 1310 has a thickness between about 2 nm and about 3 nm and is deposited over gate structures 108 and dielectric layer 200. In some embodiments, liner layer 1310 includes a metal oxide, where the metal can be a transition metal (e.g., Hf, Zr, Ti, or Al), a rare earth metal (e.g., Y, Yb, or Er), or combinations thereof. In some embodiments, liner layer 1310 is a metal oxide containing silicon (e.g., a silicate) material. By comparison, fill layer 1320 can be a silicon nitride ($Si_2N_3$) or a silicon oxide ($SiO_2$) layer different from dielectric layer 200. In some embodiments, fill layer 1320 reduces the combined dielectric constant of hard mask layer 1300 and therefore reduces the hard mask layer's overall contribution to the parasitic capacitance.

In some embodiments, liner layer 1310 is a first metal oxide ($MlO_x$) layer and fill layer 1320 is a second metal oxide layer ($M2O_x$). In some embodiments, fill layer 1320 has a lower dielectric constant than liner layer 1310 so that the combined dielectric constant of hard mask layer 1300 is closer to the dielectric constant of fill layer 1320. In some embodiments, liner layer 1310 is an oxide formed from a transition metal, a rare earth metal, or combinations thereof. In some embodiments, fill layer 1320 includes an oxide formed from a transition metal (e.g., Hf, Zr, Ti, or Al), a rare earth metal (e.g., Y, Yb, or Er), an aluminate ($MAl_xO_y$), a metal-silicate ($MSiO_x$), or combinations thereof.

Figure 13:
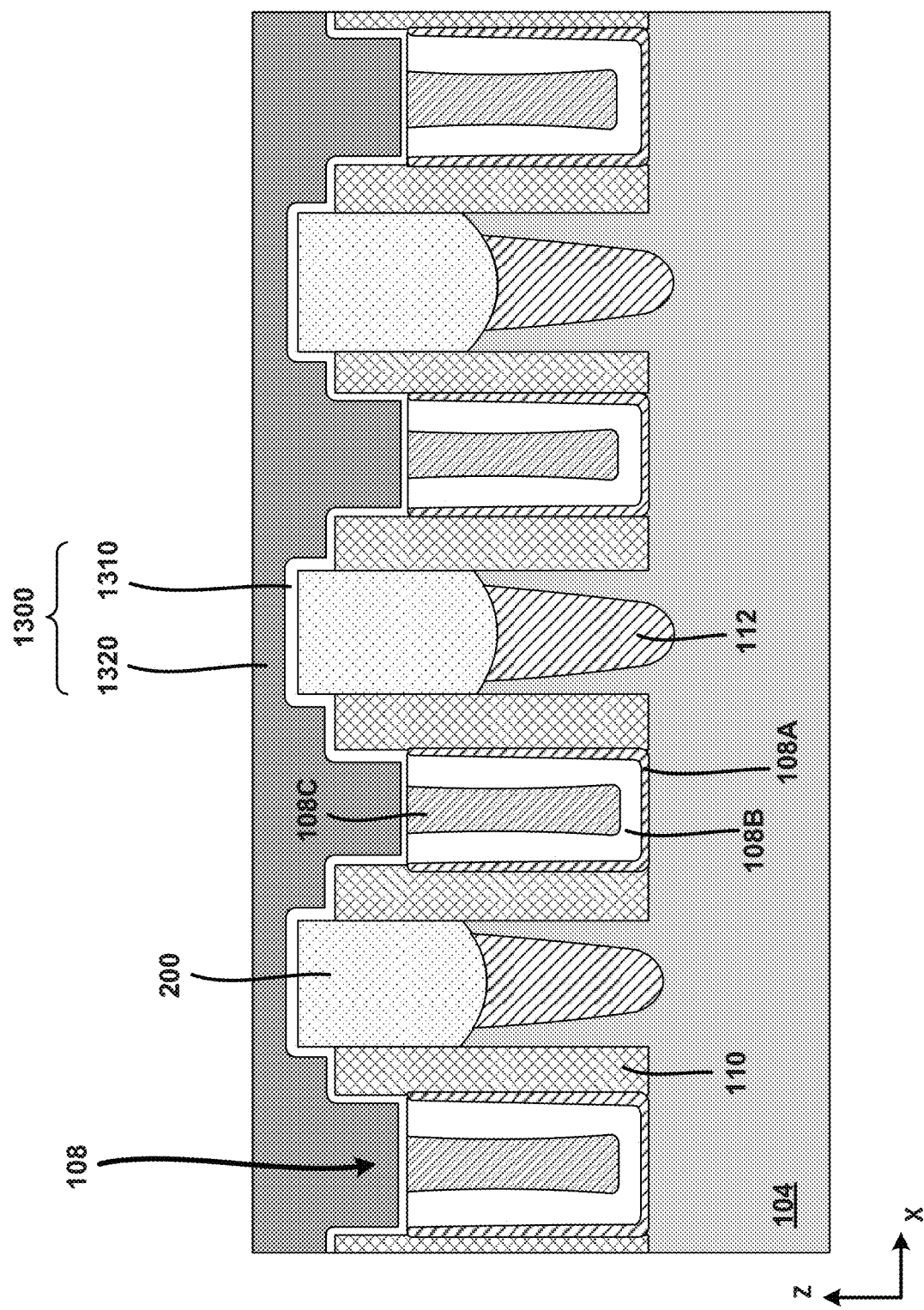
FIG. 13 is a cross-sectional view of fin field-effect transistor (finFET) structures after a bilayer hard mask deposition in accordance with some embodiments.
Figure 14:
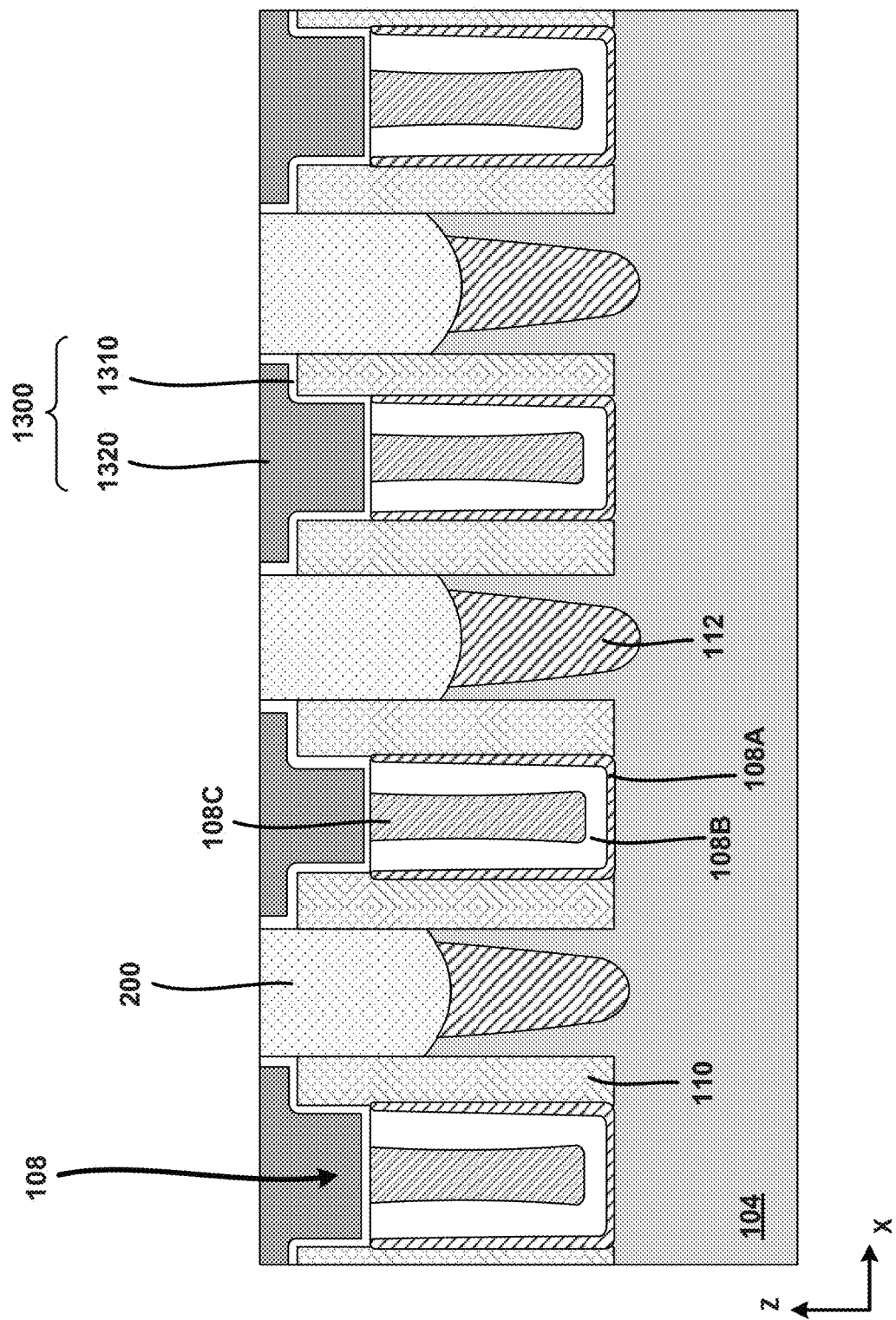
FIG. 14 is a cross-sectional view of fin field-effect transistor (finFET) structures having a bilayer hard mask in accordance with some embodiments.
Figure 15:
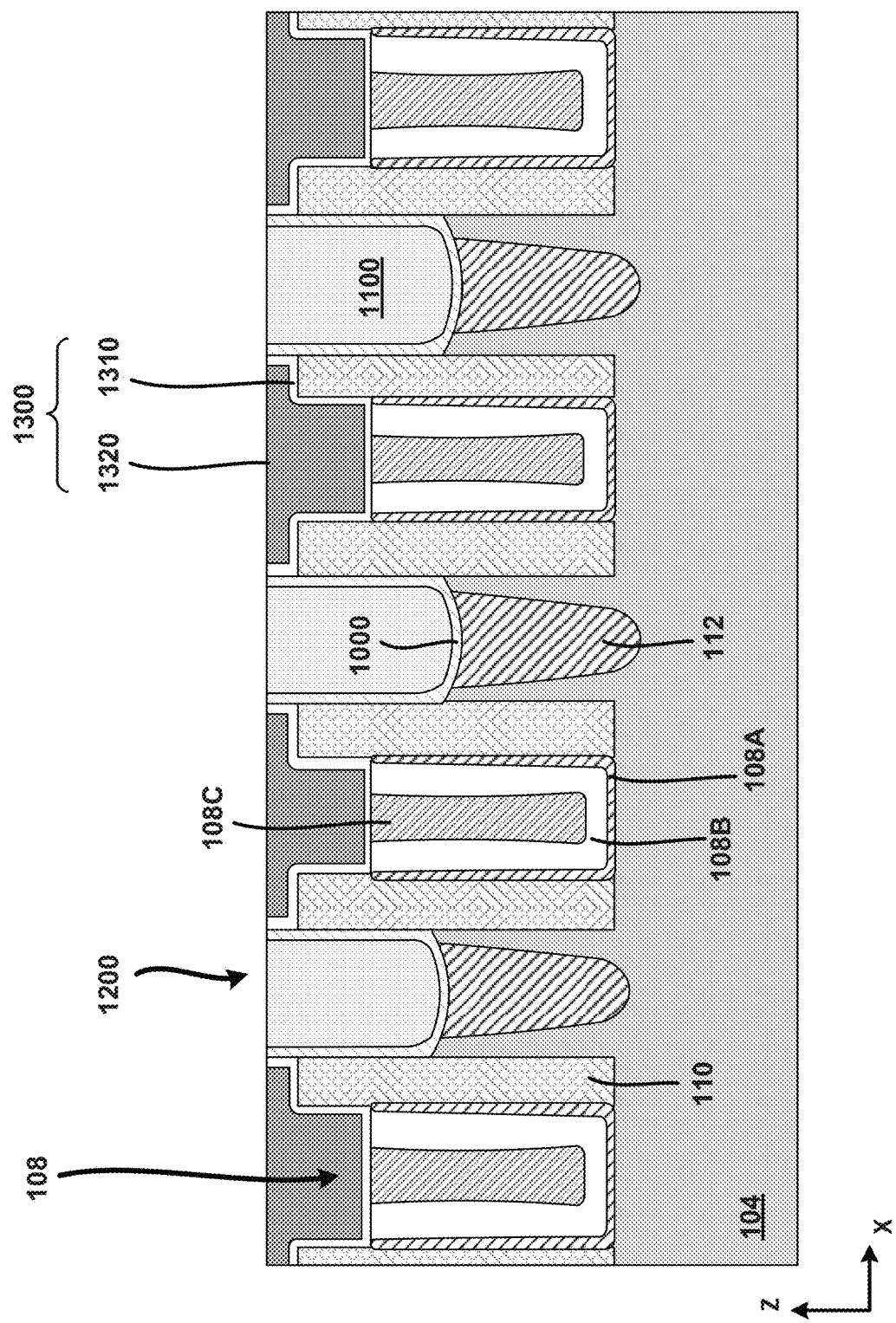
FIG. 15 is a cross-sectional view of fin field-effect transistor (finFET) structures with a bilayer hard mask and source/drain contact structures in accordance with some embodiments.

According to some embodiments, FIG. 14 shows the structure of FIG. 13 after the planarization operation described in FIG. 7, and FIG. 15 shows the structure of FIG. 14 after the formation planarization operation described in FIG. 12.

Figure 16:
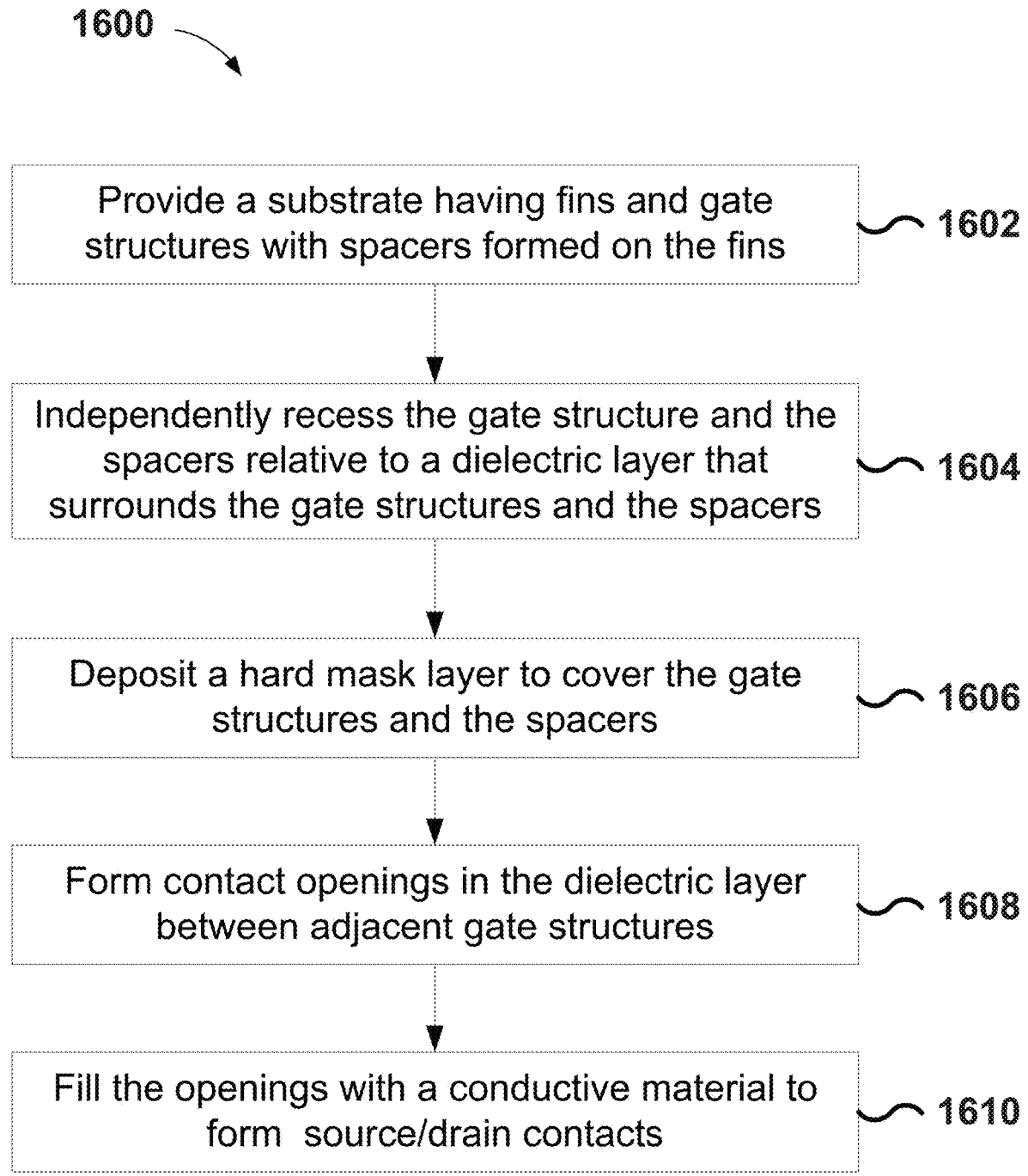
FIG. 16 is a flow chart describing a method for forming a hard mask layer in accordance with some embodiments.

FIG. 16 is a flow-chart of an exemplary method 1600 for forming a single hard mask layer or, alternatively, a hard mask bilayer on the gate structures and the gate structure spacers of finFETs to mitigate excessive gate height loss and corner rounding of the gate structures during a S/D contact formation process. Other fabrication operations may be performed between the various operations of exemplary silicide formation method 1600 and may be omitted for clarity. By way of example and not limitation, method 1600 will be described in reference to FIGS. 1-15 discussed above.

Method 1600 begins with operation 1602 where a substrate is provided having fins and gate structures with spacers formed on the fins. By way of example and not limitation, such substrate can be substrate 102 shown in FIG. 1 having fins 104. According to FIG. 1, gate structures 108 having spacers 110 are formed on portions of fins 104.

In referring to FIG. 16, method 1600 continues with operation 1604 where gate structures 108 and spacers 110 are independently recessed relative to a dielectric layer that surrounds gate structures 108 and spacers 110. By way of example and not limitation, and referring to FIG. 3, recess 300 and recess 310 are formed for gate structures 108 and spacers 110 respectively. In some embodiments, recess 300 of gate structures 108 can be between about 15 nm and about 40 nm (e.g., between about 15 nm and about 25 nm, between about 20 nm and about 35 nm, and between about 30 nm and about 40 nm), and recess 310 of spacers 110 can be between about 2 nm and about 15 nm (e.g., between about 2 run and about 8 nm, between about 6 nm and about 12 nm, and between about 10 nm and about 15 nm).

As discussed above, depending on the etch resistance (e.g., the type) of the mask layer material, recess 310 can be adjusted accordingly to control the thickness of the formed hard mask layer over spacers 110. For example, if hard mask layer 400 is polycrystalline, a short recess 310 may be used (e.g., about 5 nm). If hard mask layer 400 is a laminate, a larger recess 310 may be used (e.g., about 10 nm). Finally, if hard mask layer 400 is amorphous, an even larger recess 310 may be used (e.g., about 15 nm) since the hard mask material consumption during the etching process is expected to be higher.

The recess process may involve two or more etching operations with respective etching chemistries selective to the spacer and gate structure materials. According to some embodiments, recesses 300 and 310 facilitates the formation of a capping layer or hard mask that protects gate structures 108 and the top surfaces of spacers 110 during the process of forming the S/D contact openings in dielectric layer 200.

In referring to FIG. 16, method 1600 continues with operation 1606 and the process of depositing a hard mask layer to cover recessed gate structures 108 and spacers 110 as shown for hard mask layer 400 in FIG. 4. In some embodiments, the hard mask material includes a metal oxide ($MO_x$), a metal nitride ($MN_x$), a metal carbide ($MC_x$), a metal-aluminate ($MAl_xO_y$), a combination of two metal oxides ($MlO_x/M2O_x$), a metal-silicate ($MSiO_x$), or combinations thereof. In some embodiments, the metal in the above-mentioned materials is a transition metal (e.g., Hf, Zr, Ti, or Al), a rare earth metal (e.g., Y, Yb, or Er), or combinations thereof. According to some embodiments, the hard mask layer has a polycrystalline microstructure, an amorphous microstructure, or is a laminated structure of alternating layers of amorphous and polycrystalline layers as discussed in FIG. 5 for hard mask layer types 400A, 400B, and 400C. In some embodiments, the microstructure of the hard mask layer affects the etching resistance against a chlorine-based etching chemistry used in the process of forming S/D openings in dielectric layer 200. For example, and referring to FIG. 5, type 400A (e.g., polycrystalline) is more etch resistant than types 400B and 400C, and type 400C (e.g., hybrid) is more etch resistant than type 400B (e.g., amorphous). However, each hard mask layer type 400A, 400B, and 400C is more etch resistant than the spacer material (e.g., silicon nitride). Further, types 400B (e.g., amorphous) and 400C (e.g., hybrid) can have a lower dielectric constant (k-value) than type 400A. Thus, in some embodiments, hard mask layer types 400B and 400C may be more appropriate than type 400A (polycrystalline) for FETs that are sensitive to parasitic capacitances.

In some embodiments, the hard mask layer is a bilayer that includes a liner layer and a fill layer. For example, referring to FIG. 13, hard mask layer 1300 includes liner layer 1310 and fill layer 1320. Liner layer can include a metal oxide where the metal can be transition metal (e.g., Hf, Zr, Ti, or Al), a rare earth metal (e.g., Y, Yb, or Er), or combinations thereof. In some embodiments, liner layer 1310 is a metal oxide containing silicon (e.g., a silicate) material. By comparison, fill layer 1320 can be a silicon nitride ($Si_2N_3$) or a silicon oxide ($SiO_2$) layer different from dielectric layer 200. In some embodiments, liner layer 1310 is a first metal oxide layer and till layer 1320 is a second metal oxide layer. In some embodiments, fill layer 1320 has a lower dielectric constant than liner layer 1310 so that the combined dielectric constant of hard mask layer 1300 is closer to the dielectric constant of fill layer 1320. In some embodiments, liner layer 1310 is an oxide formed from a transition metal, a rare earth metal, or combinations thereof. In some embodiments, fill layer 1320 includes an oxide formed from a transition metal (e.g., Hf, Zr, Ti, or Al), a rare earth metal (e.g., Y, Yb, or Er), an aluminate ($MAl_xO_y$), metal-silicate ($MSiO_x$), or combinations thereof.

After the formation of the hard mask layer, the hard mask layer is planarized with a CMP process. In some embodiments, the planarization process is terminated when dielectric layer 200 is exposed so that the top surfaces of dielectric layer 200 and the hard mask layer are substantially co-planar, as discussed with respect to FIGS. 7 and 14.

In referring to FIG. 16, method 1600 continues with operation 1608 and the process of forming S/D contact openings in dielectric layer 200 between adjacent gate structures 108 as shown in FIG. 9. As discussed above with reference to FIG. 9, in some embodiments, the etching process used when forming S/D contact openings 900 is anisotropic and highly selective towards dielectric layer 200. By way of example and not limitation, the selectivity ratio between dielectric layer 200 and spacers 110 can be about 3:1 and between dielectric layer 200 and hard mask layer 400 about 10:1. Since hard mask layer 400 is exposed to the etching chemistry, the shape of hard mask layer 400 can change during the etching process. For example, as shown in FIG. 9, the top and side surfaces 400E of hard mask layer 400 can become rounded as they get etched by the etching chemistry. Consequently, hard mask layer 400 may suffer a thickness loss during etching. In some embodiments, the etched amount of hard mask material depends on the type of hard mask layer 400. According to some embodiments, there is a correlation between the etch resistance of hard mask layer 400—which is directly related to the hard mask type as discussed above—and the thickness loss the hard mask layer will experience while S/D contact openings 900 are formed. For example, a polycrystalline hard mask (e.g., type 400A) would have the least amount of thickness loss compared to a laminate hard mask (e.g., type 400C) and an amorphous hard mask (e.g., type 400B) respectively. Further, an amorphous hard mask will have the highest amount of thickness loss because it has the lowest etching resistance. Thus, the thickness of the hard mask layer can be adjusted depending on the microstructure of the deposited hard mask layer.

In referring to FIG. 16, method 1600 concludes with operation 1610 and the process of forming the S/D contacts by filling openings 900 with one or more conductive materials (e.g., liner layer 1000 and conductive material 1100 shown in FIG. 12). In some embodiments, a planarization process, such as a CMP process, can be used to polish the structure as shown in FIGS. 12 and 15. After the planarization process, the top surfaces of hard mask layer 400 (or 1300), liner layer 1000, and conductive material 1100 are substantially co-planar. The aforementioned planarization process completes the process of forming S/D contacts 1200. By way of example and not limitation, the planarization process removes about 20 nm from hard mask layer 400 (or 1300). In some embodiments, the height 400H' of hard mask layer 400 (or 1300) can be between about 20 and about 40 nm after the planarization process of conductive material 1100.

The present disclosure is directed to a method for forming of a hard mask on a transistor's gate structure that can minimize or eliminate gate spacer loss, gate height loss, and gate corner rounding during the process of forming S/D SAC openings. Consequently, the polish amount can be reduced to limit the gate height loss to less than about 20 nm. In some embodiments, etching resistance of the hard mask layer can be modulated through the microstructure of the as-deposited mask layer material. According to some embodiments, the hard mask layer can be polycrystalline, homogenous amorphous, a laminate structure having alternating layers of amorphous and polycrystalline layers, or a Mayer structure having a liner layer and a fill layer. In some embodiments, the hard mask layer includes a metal-oxide ($MO_x$), a metal-silicate ($MSi_xO_y$), a metal-aluminate ($MAl_xO_y$), a metal-nitride ($MN_x$), a metal-carbide ($MC_x$), or combinations thereof. Further, the metal of the hard mask layer can include a transition metal (e.g., Hf, Zr, Ti, or Al), a rare earth metal (e.g., Y, Yb, or Er), or combinations thereof. If the hard mask layer is a bi-layer, it can include a silicon-based insulator (e.g., silicon nitride (SiN) or silicon oxide ($SiO_2$)) fill layer surrounded by a metal-containing insulator liner layer that includes Hf, Zr, Ti, Y, Yb, Er, Al, Si, or combinations thereof. In some embodiments, if the hard mask layer is a hi-layer, it can include a first metal-containing insulator fill layer surrounded by a second metal-containing insulator liner layer. The first metal-containing insulator fill layer can be a metal oxide that includes a transition metal or a rare earth metal, such as Hf, Zr, Ti, Y, Yb, Er, or Al; and the second metal-containing insulator liner layer can include a metal-silicate or a metal-aluminate compound that includes a transition metal or a rare earth metal, such as Hf, Zr, Ti, Y, Yb, Er, or Al. In some embodiments, the fill layer has a lower dielectric constant compared to the liner layer.

In some embodiments, a structure includes a substrate with fins thereon and gate structures disposed on the fins, where the gate structures are spaced apart by conductive structures. The structure further includes a spacer interposed between each conductive structure and gate structure; a metal containing hard mask layer covering a top surface of the gate structures, a top surface of each spacer, and a sidewall portion of the conductive structures.

In some embodiments, a structure includes a substrate with fins thereon and gate structures disposed on the fins, where the gate structures are spaced apart by conductive structures. The structure also includes a spacer interposed between each conductive structure and gate structure; and a metal containing hard mask layer covering a top surface of the gate structures, a top surface of each spacer, and a sidewall portion of the conductive structures. Further, the metal containing layer includes a liner layer having a first metal oxide and a fill layer having a second metal oxide different from the first metal oxide.

In some embodiments, a method includes forming fins on a semiconductor substrate and gate structures on a top portion of the fins, where the gate structures are spaced apart and include a gate dielectric stack and metallic layers. The method further includes forming spacers on sidewalls of the gate structures and disposing a dielectric layer between the gate structures so that the spacers are interposed between the gate structures and the dielectric layer. The method also includes etching top surfaces of the gate structures and top surfaces of the spacers with respect to a top surface of the dielectric layer so that the top surfaces of the spacers are below the top surface of the dielectric layer and the top surfaces of the gate structures are below the top surfaces of the spacers. Additionally, the method includes depositing a hard mask layer having a metal containing dielectric layer over the etched top surfaces of the gate structures and the spacers and etching the dielectric layer with an etching chemistry to form contact openings between the spacers, where the hard mask layer has a lower etch rate than the spacers when exposed to the etching chemistry.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate with fins thereon;
   gate structures disposed on the fins, wherein the gate structures are spaced apart by conductive structures;
   a spacer interposed between each conductive structure and gate structure; and
   a metal containing hard mask layer covering a top surface of the gate structures, a top surface of each spacer, and a sidewall portion of the conductive structures, wherein a sidewall portion of the metal containing hard mark layer above the spacer is in contact with a sidewall portion of the conductive structures.

2. The structure of claim 1, wherein an other sidewall portion of the metal containing hard mask layer below a top surface of the spacer is in contact with a sidewall portion of the spacer.

3. The structure of claim 1, wherein the metal containing hard mask layer comprises a polycrystalline material, an amorphous material, or a laminate stack with alternating polycrystalline and amorphous layers.

4. The structure of claim 1, wherein the metal containing hard mask layer comprises a metal oxide ($MO_x$), a metal nitride ($MN_x$), a metal carbide ($MC_x$), a metal-aluminate ($MAl_xO_y$), a combination of two metal oxides ($M1O_x$/$M2O_x$), a metal-silicate ($MSiO_x$), or combinations thereof.

5. The structure of claim 1, wherein the metal containing hard mask layer comprises hafnium (Hf), zirconium (Zr), titanium (Ti), aluminum (Al), yttrium (Y), ytterbium (Yb), erbium (Er), or combinations thereof.

6. The structure of claim 1, wherein the metal containing hard mask layer comprises:
   a metal containing liner layer comprising hafnium (H), zirconium (Zr), titanium (Ti), aluminum (Al), yttrium (Y), ytterbium (Yb), erbium (Er), or combinations thereof; and
   a silicon containing fill layer comprising nitrogen or oxygen.

7. The structure of claim 6, wherein the metal containing liner layer has a higher dielectric constant than the silicon containing fill layer.

8. The structure of claim 1, wherein the metal containing hard mask layer comprises:
   a liner layer with a first metal oxide comprising a first transition metal, a first rare earth metal, or combinations thereof; and
   a fill layer with a second metal oxide comprising a second transition metal, a second rare earth metal, an aluminate ($MAl_xO_y$), a metal-silicate ($MSiO_x$), or combinations thereof, wherein the fill layer has a lower dielectric constant than the first metal oxide.

9. A structure, comprising:
   a substrate with fins thereon;
   gate structures disposed on the fins, wherein the gate structures are spaced apart by conductive structures;
   a spacer interposed between each conductive structure and gate structure; and
   a metal containing hard mask layer covering a top surface of the gate structures, a top surface of each spacer, and a sidewall portion of the conductive structures, wherein a substantially vertical sidewall portion of the metal containing hard mark layer above the spacer is in contact with a sidewall portion of the conductive structures, and wherein the metal containing hard mask layer comprises:
   a liner layer comprising a first metal oxide; and
   a fill layer comprising a second metal oxide different from the first metal oxide.

10. The structure of claim 9, wherein the first metal oxide comprises a transition metal, a rare earth metal, or combinations thereof.

11. The structure of claim 9, wherein the second metal oxide comprises a transition metal, a rare earth metal, an aluminate ($MAl_xO_y$), a metal-silicate ($MSiO_x$), or combinations thereof.

12. The structure of claim 9, wherein the second metal oxide has a lower dielectric constant than the first metal oxide.

13. The structure of claim 9, wherein a pitch between the gate structures is between about 10 nm and about 20 nm, and wherein an aspect ratio of the conductive structures is between about 6:1 and about 8:1.

14. A structure, comprising:
   a substrate;
   a fin disposed on the substrate;
   a gate structure disposed on the fin;
   a source/drain (S/D) region disposed on the fin and spaced apart from the gate structure, wherein the S/D region comprises a S/D contact;
   a spacer between the gate structure and the S/D region; and
   a metal containing hard mask layer on a top surface of the gate structure, a top surface of the spacer, and a sidewall portion of the S/D contact, wherein a sidewall portion of the metal containing hard mask layer above the spacer is in contact with a sidewall portion of the S/D contact.

15. The structure of claim 14, wherein a top surface of the metal containing hard mask layer is aligned with a top surface of the S/D contact.

16. The structure of claim 14, wherein the metal containing hard mask layer comprises a polycrystalline material, an amorphous material, or a laminate stack with alternating polycrystalline and amorphous layers.

17. The structure of claim 14, wherein the metal containing hard mask layer comprises a metal oxide ($MO_x$), a metal nitride ($MN_x$), a metal carbide ($MC_x$), a metal-aluminate ($MAl_xO_y$), a combination of two metal oxides ($M1O_x$/$M2O_x$), a metal-silicate ($MSiO_x$), or combinations thereof.

18. The structure of claim 14, wherein the metal containing hard mask layer comprises:
   a metal containing liner layer comprising hafnium (H), zirconium (Zr), titanium (Ti), aluminum (Al), yttrium (Y), ytterbium (Yb), erbium (Er), or combinations thereof; and
   a silicon containing fill layer comprising nitrogen or oxygen.

19. The structure of claim 14, wherein the metal containing hard mask layer comprises:
   a liner layer comprising a first metal oxide; and
   a fill layer comprising a second metal oxide different from the first metal oxide.

20. The structure of claim 19, wherein the second metal oxide has a lower dielectric constant than the first metal oxide.

* * * * *